United States Patent
Voutsas et al.

(10) Patent No.: US 9,425,221 B2
(45) Date of Patent: Aug. 23, 2016

(54) CIRCUIT-ON-WIRE

(71) Applicant: Sharp Laboratories of America, Inc., Camas, WA (US)

(72) Inventors: Apostolos Voutsas, Portland, OR (US); Themistokles Afentakis, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 224 days.

(21) Appl. No.: 14/169,202

(22) Filed: Jan. 31, 2014

(65) Prior Publication Data

US 2015/0221682 A1 Aug. 6, 2015

(51) Int. Cl.
*H01L 29/12* (2006.01)
*H01L 27/12* (2006.01)
*H01L 29/417* (2006.01)
*H01L 29/423* (2006.01)
*H01L 21/768* (2006.01)

(52) U.S. Cl.
CPC ..... *H01L 27/1255* (2013.01); *H01L 21/76897* (2013.01); *H01L 27/124* (2013.01); *H01L 27/1259* (2013.01); *H01L 29/41733* (2013.01); *H01L 29/42384* (2013.01)

(58) Field of Classification Search
CPC ............. H01L 27/1255; H01L 27/124; H01L 27/1259; H01L 29/41733; H01L 29/42384

USPC .......................................................... 257/71
See application file for complete search history.

(56) References Cited

U.S. PATENT DOCUMENTS

| 6,911,666 | B2 | 6/2005 | Voutsas | |
|---|---|---|---|---|
| 8,016,628 | B2 | 9/2011 | Lee et al. | |
| 2004/0119071 | A1* | 6/2004 | Takahara | G02F 1/136227 257/59 |

* cited by examiner

*Primary Examiner* — Trung Q Dang
(74) *Attorney, Agent, or Firm* — Law Office of Gerald Maliszewski; Gerald Maliszewski

(57) ABSTRACT

A circuit-on-wire (CoW) is provided that is made from a flexible metal wire with an outer surface, and a plurality of discrete electrical control devices formed in series along the metal wire outer surface. Each control device may have an electrical contact accessible through the metal wire. In one aspect, the control device may have a via through the metal wire from the top surface to the bottom surface with a second electrical contact accessible through the via. In addition, the control devices may have a top surface with an accessible third electrical contact. For example, the control device may be a first thin-film transistor (TFT), with a gate electrode accessible through the metal wire, wherein the second electrical contact is a first source/drain (S/D) electrode, and wherein the third electrical contact is a second S/D electrode. Using the above-described CoW, a woven active matrix array can be fabricated.

8 Claims, 8 Drawing Sheets

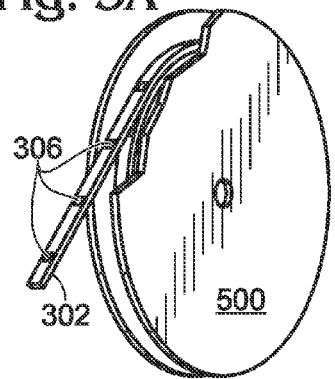
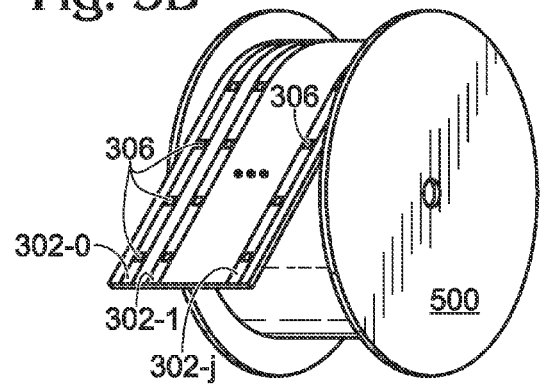
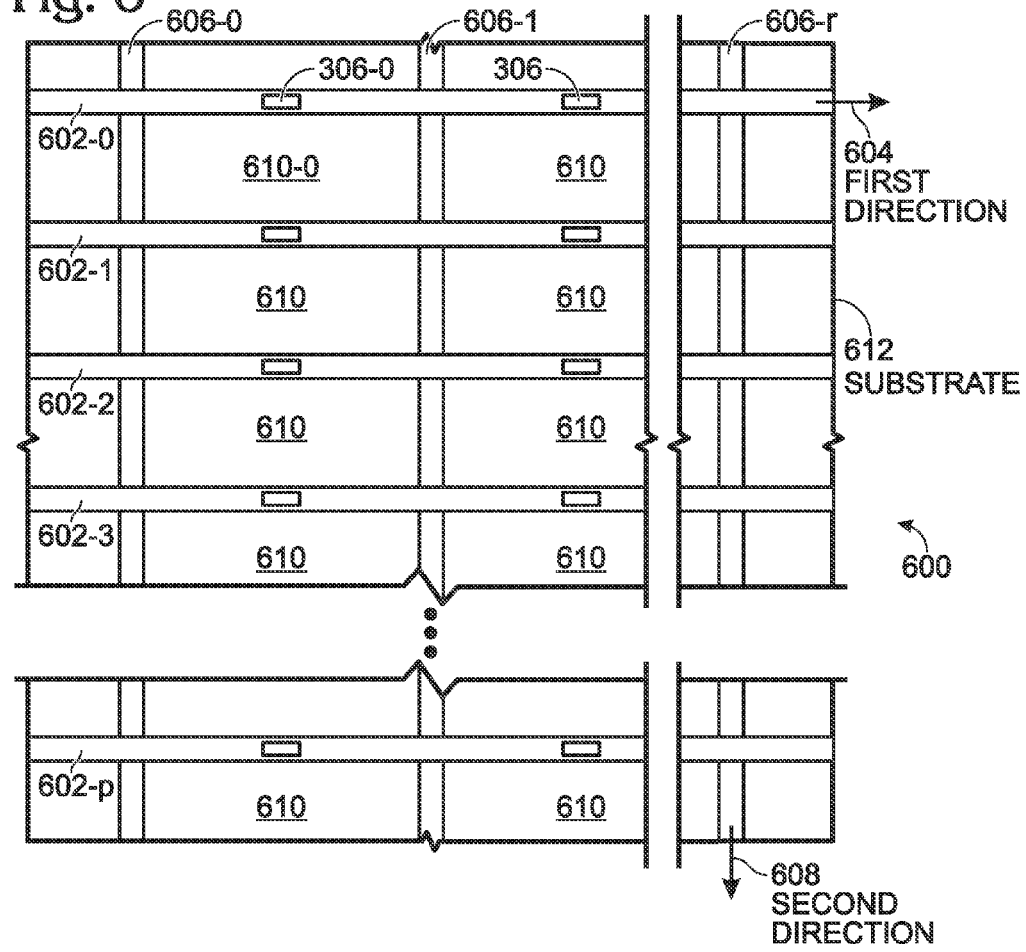

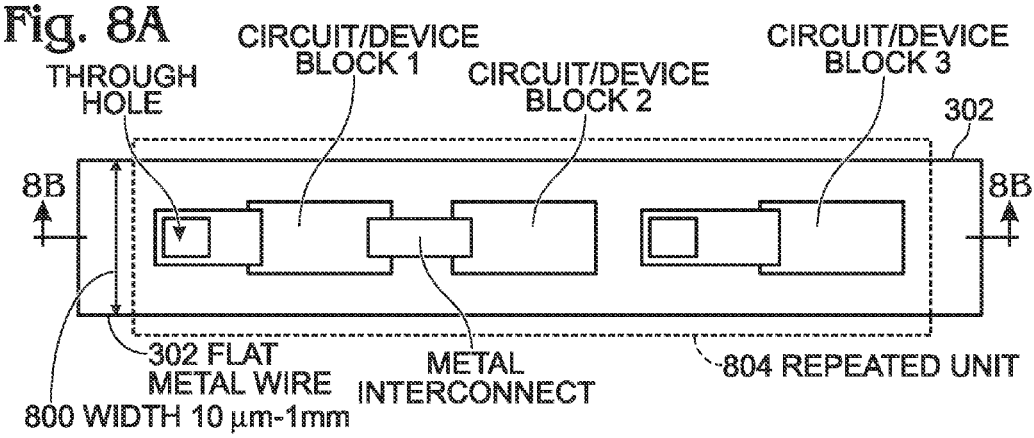
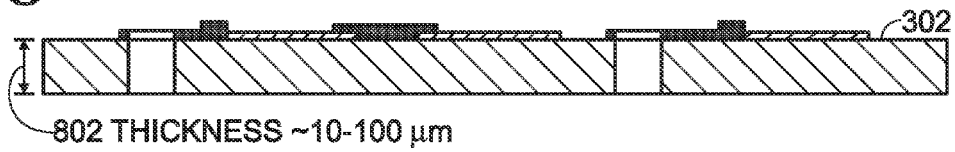
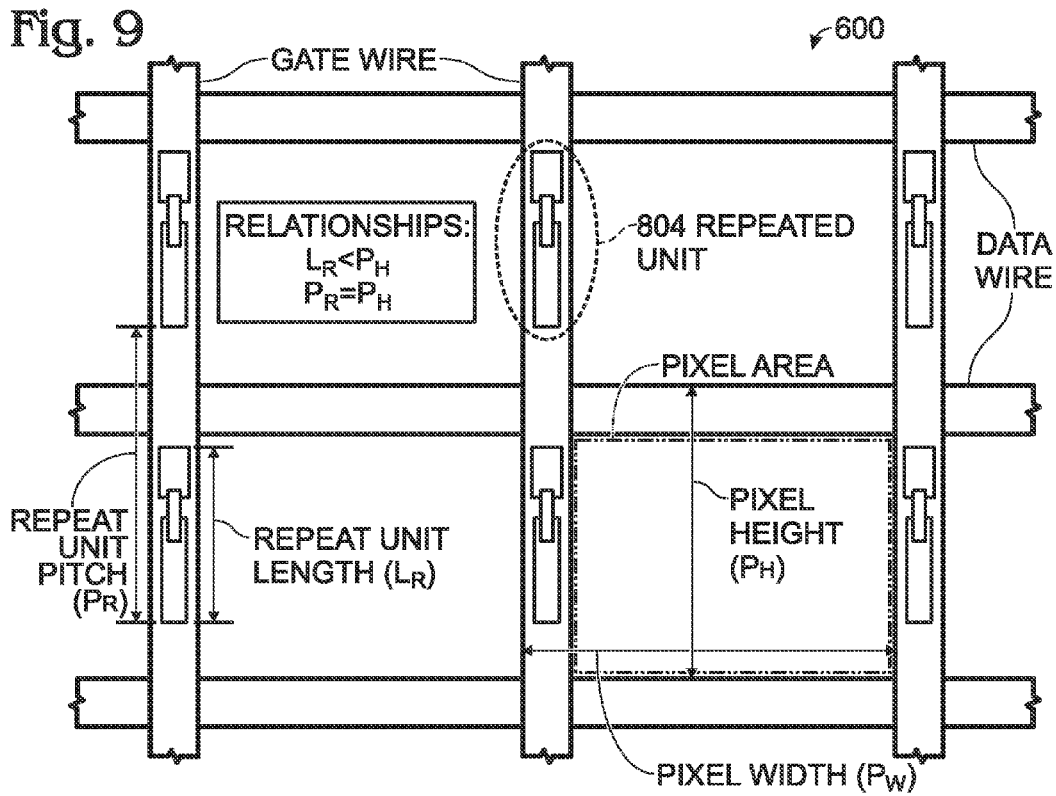

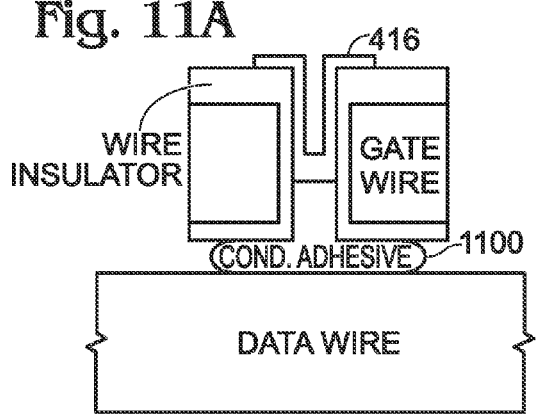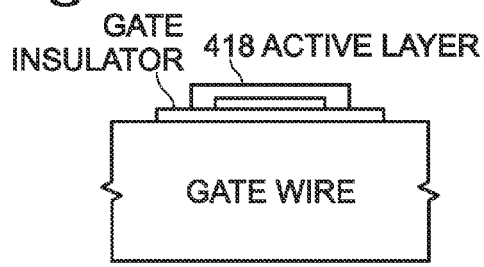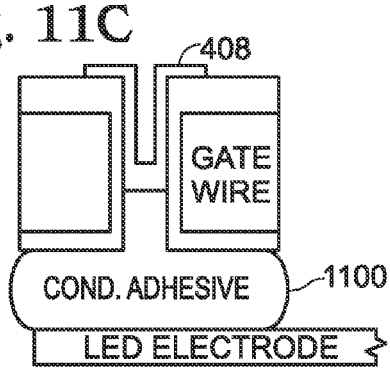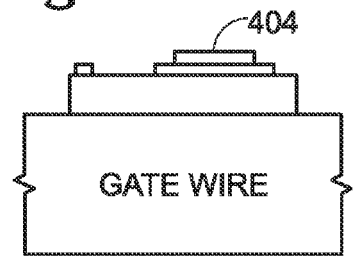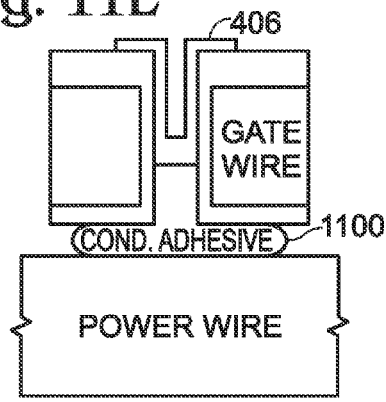

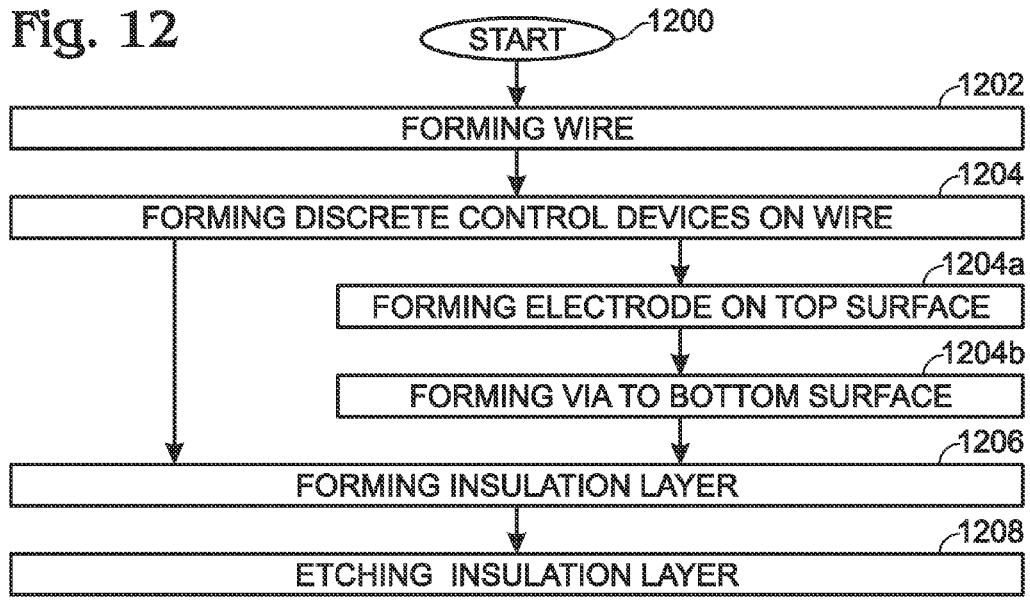
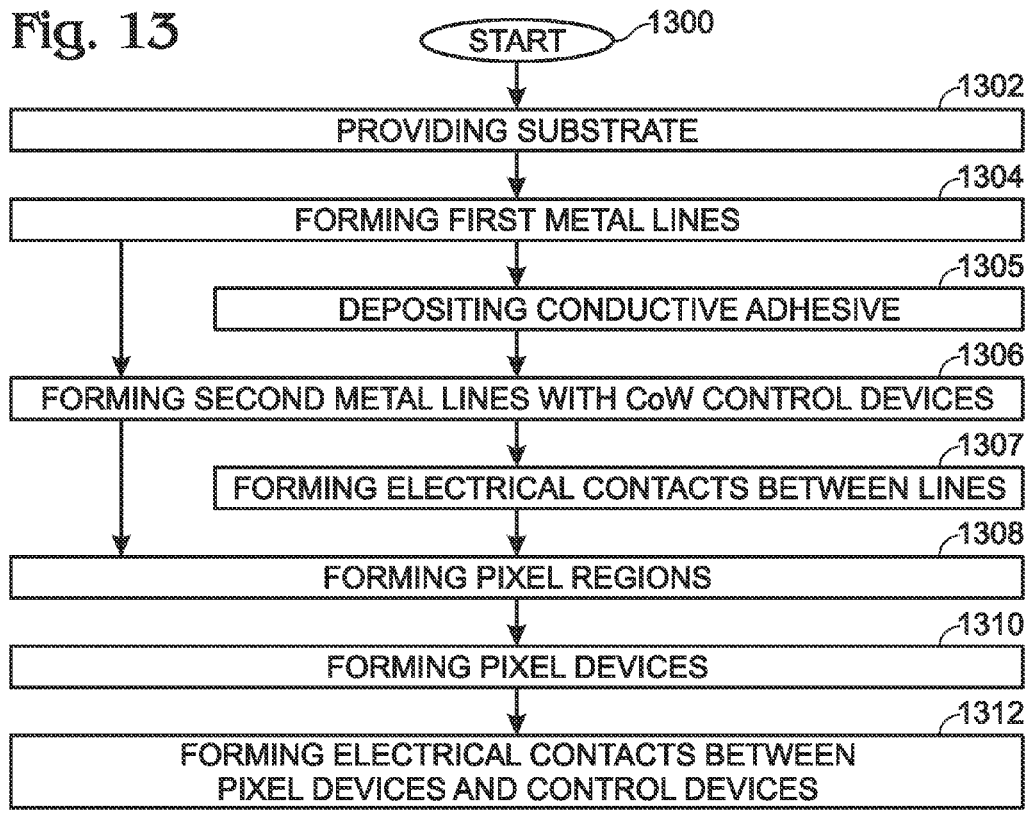

CIRCUIT-ON-WIRE

BACKGROUND OF THE INVENTION

1. Field of the Invention

This invention generally relates to display fabrication and, more particularly, to a circuit-on-wire (CoW) technology generally useful in the fabrication of large array electronic panels.

2. Description of the Related Art

The fabrication of backplane arrays for various types of flat panel displays, such as liquid crystal display (LCD) or organic light emitting diode (OLED), requires multiple deposition and photolithographic patterning (selective etching) steps. These steps must take place using specialized process equipment capable of handling the substantial size of the substrates typically used for display manufacturing. In that sense, the manufacturing cost is a function of the substrate area and, hence, tends to increase geometrically with the display size [i.e. manufacturing cost~(display diagonal)$^2$]. In order to achieve a lower product cost, manufacturing costs must be minimized. This fact is especially evident in the case of large displays, which have become increasingly ubiquitous in everyday life—from home TVs, to information and advertising digital signs.

Another important issue in display backplane fabrication is optical transparency. High optical transparency is desirable for improving display appearance (i.e. brightness) and, ultimately, for enabling a visually transparent panel that can seamlessly integrate with its surroundings and function harmoniously within its operating environment.

FIG. 1 is a plan view of a thin-film transistor (TFT) active matrix array backplane (prior art). The backplane consists of a plurality of pixel elements formed by the intersecting horizontal (gate) and vertical (data) metal lines. These pixel elements host a number of sub-components (mostly thin film transistors and capacitor elements), which function to determine the "state" of the pixel—in other words, how much light is allowed through the pixel area to reach an observer. For a highly transparent display, which one can "see through" when not displaying an image, it is desirable that the majority of the pixel area be void of any components that may obstruct the passage (transmission) of visible light. For example, referring to FIG. 1B, it is desirable to maximize the "active" area and minimize the "dead zone" area. Note: although a display backplane is depicted, the same issues apply to an active matrix array that receives and processes light, such as a charge-coupled device (CCD) camera.

FIG. 2 is a plan view of a typical LCD pixel structure (prior art). In terms of fabrication, pixels—consisting of the intersecting metal lines and the internal subcomponents—are constructed by a succession of thin-film material formation (e.g. deposition) steps and feature-patterning steps by subtractive processing (e.g. combination of photolithography and etching steps).

The pixel size is determined by the desired resolution of the panel, expressed in pixels-per-inch (PPI). For example, a 50 PPI panel consists of 508×508 micron (μm) pixels, while a 150 PPI panel consists of 169×169 μm pixels. For a full-color display, the pixel is further divided into sub-pixels—in the simplest case one sub-pixel for each of (R)ed, (G)reen and (B)lue. As a result, the ultimate sub-pixel size is given (in μm) by the formula: 25400/(3·PPI), where PPI refers to the target panel resolution. In the ideal case, all the pixel area contributes to light transmission, but practically, only a portion of the pixel area actually transmits light. As shown in FIG. 2 for example, light transmission is blocked by the capacitor(s), TFT(s), and width of metal wires (horizontal & vertical). The area of these components tends to scale with the overall pixel area. For very small pixels, the effective pixel area (expressed often by the term aperture ratio) tends to become prohibitively small. For a high quality transparent display, aperture ratios (the ratio of transmissive area to total pixel area) of more than 85% are typically demanded.

It would be advantageous if a means existed for fabricating an active matrix array with a larger aperture ratio. It would also be advantageous if this fabrication means permitted the active matrix arrays to be produced at a lower cost.

SUMMARY OF THE INVENTION

Disclosed herein is an apparatus and method of manufacture that permits pixel subcomponents to be moved from the pixel transmissive area, as is conventional, to the pixel's metal wiring frame. In doing so, two key objectives are accomplished. First, manufacturing costs are reduced by preparing the circuit-on-wire off-line, and then "weaving" it onto the panel using a simplified assembly scheme. This process allows the manufacturing cost to scale with the length of the panel, as opposed to the area of the panel. Second, the use of the circuit-on-wire (CoW) significantly improves (increases) the pixel aperture ratio, and, ultimately achieves a sufficiently high pixel aperture to evoke the feeling of transparency.

The notion of an effective transparent display implicitly requires an emissive technology to be achieved. In other words, a liquid crystal display (LCD) embodiment is limited in its capacity to achieve a high quality transparent display—mostly due to the necessity of having a pair of crossed polarizers at the two sides of the LCD module that block almost half of the outgoing light. On the other hand, a display enabled by light emitting diodes (LEDs), either organic or inorganic, can provide a much more effective path to transparency if the effective pixel area can be sufficiently enlarged, since polarizers are not required.

Accordingly, a CoW is provide that is made from a flexible metal wire with an outer surface, and a plurality of discrete electrical control devices formed in series along the metal wire outer surface. Each control device may have a first electrical contact accessible through the metal wire. In one aspect, the metal wire has an outer top surface and an outer bottom surface. Then, the control device may have a via through the metal wire from the top surface to the bottom surface with a second electrical contact accessible through the via. In addition, the control devices may have a top surface with an accessible third electrical contact. For example, the control device may be a first thin-film transistor (TFT), with a gate electrode accessible through the metal wire, with the second electrical contact being a first source/drain (S/D) electrode, and the third electrical contact being a second S/D electrode.

Using the above-described CoW, a woven active matrix array may be fabricated, made from a set of parallel first metal lines aligned in a first direction and a set of parallel second metal lines aligned in a second direction orthogonal to the first direction. The first metal lines intersect the second metal lines to form pixel regions. A plurality of metal lines from the second metal lines are made with serially configured CoW control devices overlying an outer surface of the second metal line, with each control device being associated with a corresponding pixel region.

Additional details of the above-described devices as well as fabrication methods are provided in more detail below.

BRIEF DESCRIPTION OF THE DRAWINGS

FIGS. 5A and 5B depict two variations of CoW packaging.

FIG. 6 is a plan view of a woven active matrix array.

FIGS. 8A and 8B are, respectively, plan and cross-sectional views of a CoW control device repeated unit.

FIG. 9 is a plan view of an active matrix array with repeated units.

FIGS. 11A through 11E are partial cross-sectional views of the CoW pixel switching element of FIG. 10B.

FIG. 12 is a flowchart illustrating a method for forming a CoW.

FIG. 13 is a flowchart illustrating a method for forming a woven active matrix array.

DETAILED DESCRIPTION

Figure 1:
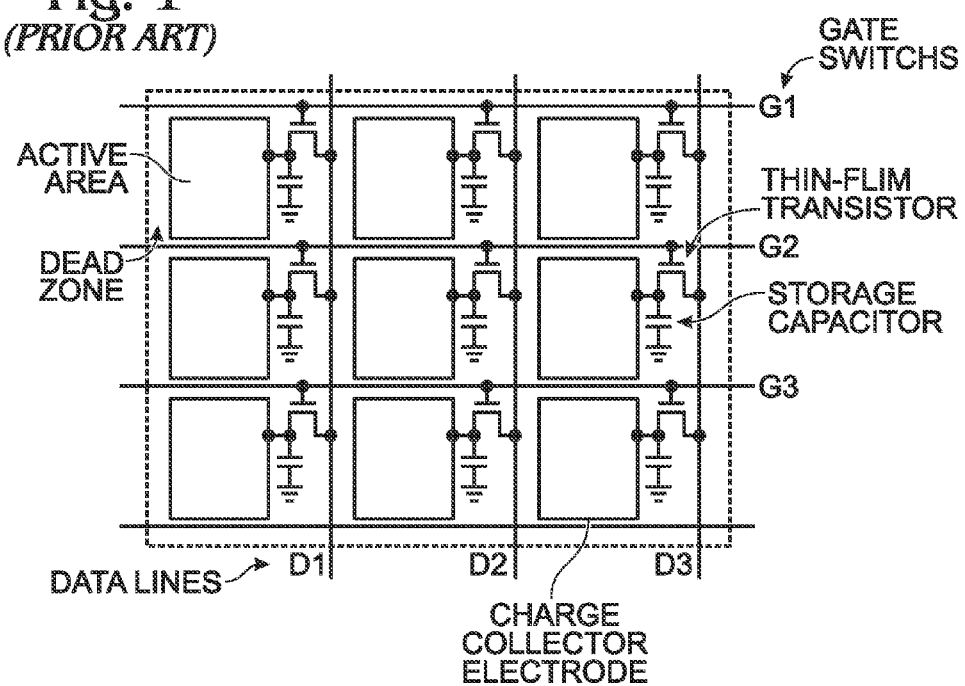
FIG. 1 is a plan view of a thin-film transistor (TFT) active matrix array backplane (prior art).
Figure 2:
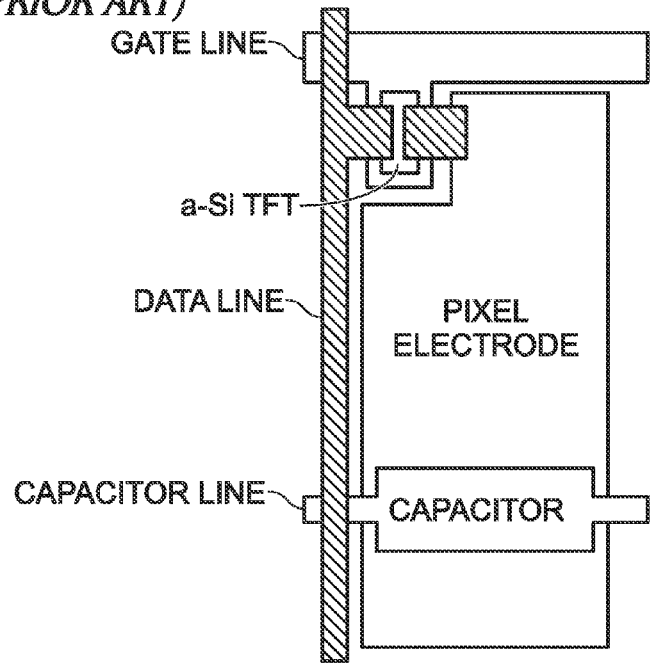
FIG. 2 is a plan view of a typical LCD pixel structure (prior art).
Figure 3:
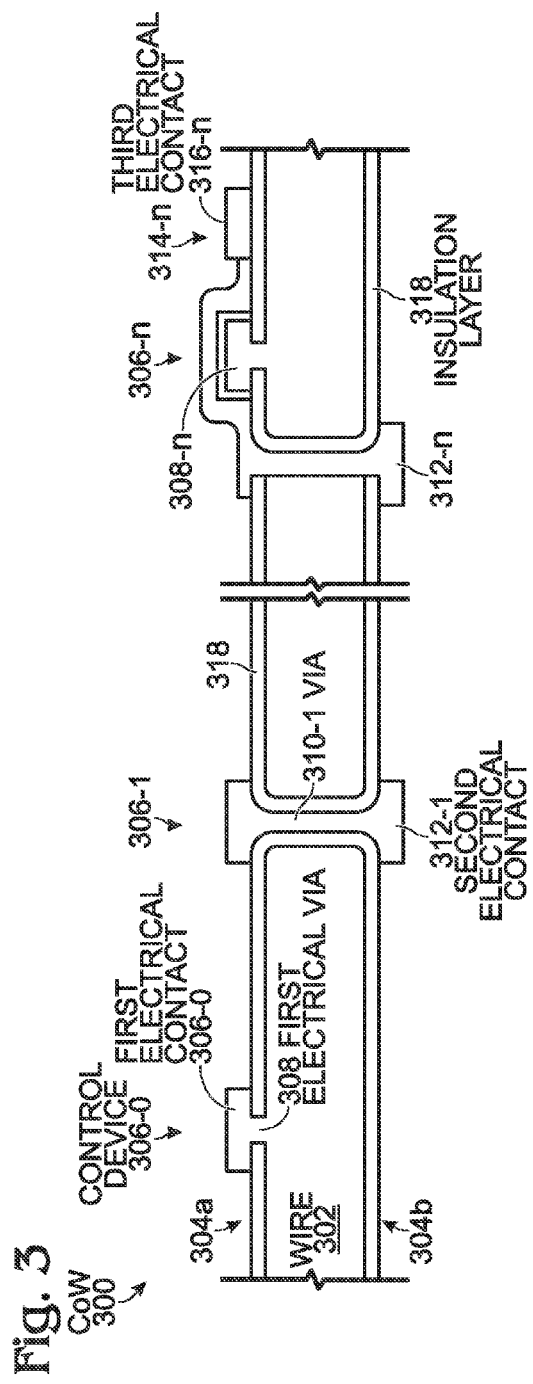
FIG. 3 is a partial cross-sectional view of a circuit-on-wire (CoW).

FIG. 3 is a partial cross-sectional view of a circuit-on-wire (CoW). The CoW 300 comprises a flexible metal wire 302 with an outer surface 304. A plurality of discrete electrical control devices are formed in series along the metal wire outer surface 304. Shown are control devices 306-0 through 306-n, where n is an integer not limited to any particular value. In one aspect, the control devices, e.g., device 306-0, comprise a first electrical contact 308-0 accessible through the metal wire 302. Typically, the metal wire 302 is electrically conductive. Alternatively, some or all of the control devices may be electrically isolated from the metal wire 302.

In one aspect, the metal wire may be said to comprise an outer top surface 304a and an outer bottom surface 304b. For example, the metal wire 302 is relatively flat or oval in its cross-section (not shown). A plurality of control devices, e.g., control device 306-1, may comprise a via 310-1 through the metal wire from the top surface 304a to the bottom surface 304b, and a second electrical contact 312-1 accessible through the via. In another aspect, a plurality of control devices, e.g., control device 306-n, each further comprise a top surface 314-n with an accessible third electrical contact 316-n. For example, control device 306-n may be a first thin-film transistor (TFT), with a gate electrode 308-n accessible through the metal wire 302, with the second electrical contact 312-n being a first source/drain (S/D) electrode (or a contact in electrical communication with the first S/D electrode), and the third electrical contact 316-n being a second S/D electrode (or a contact in electrical communication with the second S/D electrode). Typically, an insulation layer 318 overlies the metal wire top 304a and bottom surfaces 308b, and is selectively etched to expose control device electrodes. In one aspect, the etching is performed during CoW fabrication. Alternatively, the etching may be performed as the CoW is integrated into a higher assembly.

It should be understood that the sequential control devices may be the same or different types of devices. In one aspect, some of the devices need not be active. As explained in more detail below, a collection of control devices may be grouped in repeated units, where each repeated unit may be associated with a manufacturing sub-component, such as an active matrix array pixel.

Figure 4:
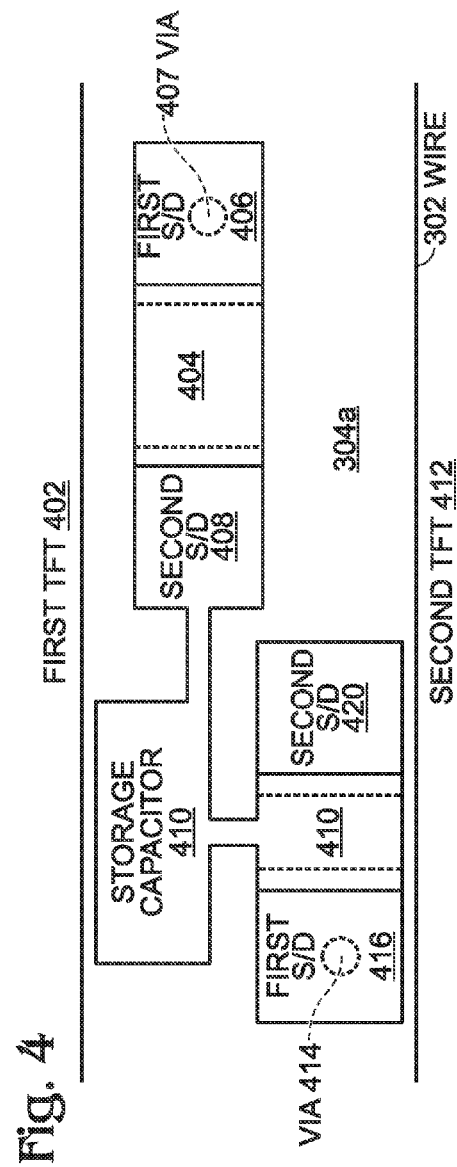
FIG. 4 is a plan view of a pixel switching element control device.

FIG. 4 is a plan view of a pixel switching element control device. The pixel switching element 400 comprises a first TFT 402, similar to control device 306-n of FIG. 3, with a gate electrode 404 (in phantom) accessible through the metal wire 302, the second electrical contact 406 being a first S/D electrode with a via 407 (in phantom) connected to the bottom side of the wire, and the third, exposed electrical contact 408 being a second S/D electrode. A storage capacitor 410 is connected to the second S/D electrode 408 of the first TFT. A second TFT 412 comprises a via 414 through the metal wire 302 from the top surface 304a to the bottom surface 304b. A first S/D electrode 416 is accessible through the via 414. A gate electrode 418 is connected the second S/D electrode 408 of the first TFT. The second TFT 412 further comprises a second S/D electrode 420. The pixel switching element is one example of a complete or partial repeated unit, described in more detail below.

FIGS. 5A and 5B depict two variations of CoW packaging. In FIG. 5A the metal wire 302 with control devices 306 is wound around a spool 500, permitting the wire to be unwound, sectioned, and/or laid flat during use at a higher assembly. In FIG. 5B, a plurality of adjacent metal wires 302-0 through 302-j are shown, where j is an integer greater than 1, wound around the spool 500. Each metal wire 302-0 through 302-j includes a plurality of discrete electrically active control devices 306 formed in series along its outer surface. Advantageously, this spooling permits the simultaneous deployment of a plurality of metal lines for the purpose, for example, of an active array fabrication. In comparing particular wires 302-0 through 302-j, the control devices thereon need not necessarily be identical. Further, even if the devices, and the order of the devices 306 is identical, the alignment of devices between wires may or may not be staggered.

The spool of FIG. 5A is attractive for relatively small roll-to-roll (R-2-R) machine operations, while the spool of FIG. 5B is more applicable to the creation of large web lines used with a process performed on very large sheets. For sheet-to-sheet operation, thousands of wires can be formed on a large sheet, despoiled, and then cut to generate long strips that can be laid down to make arrays. The advantage in this case is fill factor, as a typical array has much empty space where the pixels are eventually formed.

FIG. 6 is a plan view of a woven active matrix array. The array 600 comprises a set of parallel first metal lines 602-0 through 602-p, where p is an integer greater than 1, aligned in a first direction 604. A set of parallel second metal lines 606-0 through 606-r, where r is an integer greater than 1, is aligned in a second direction 608 orthogonal to the first direction 604. The first metal lines 602 intersect the second metal lines 606 to form pixel regions 610. A plurality, or all of the metal lines from the second metal lines 606-0 through 606-r comprise serially configured CoW control devices 306 overlying an outer surface of the second metal line, as described above in the explanation of FIGS. 3 and 4. Each control device 306 is typically associated with a corresponding pixel region 610. For example, control device 306-0 is associated with pixel region 610-0. Details of the control devices have been presented above, and are not repeated here in the interest of brevity. In the case of the pixel switching element of FIG. 4 for example, a pixel device such as an LED or charge-coupled sensor (not shown) is connected to the second S/D electrode of each second TFT.

The first metal lines 602-0 through 602-$p$ may be gate lines, and the second metal lines 606-0 through 606-$r$ may be data lines, as shown. Alternatively, the first metal lines 602-0 through 602-$p$ may be data lines, and the second metal lines 606-0 through 606-$r$ may be gate lines. In another aspect not shown, both the gate and control lines may be CoW, with control devices. The array 600 may be formed on a transparent substrate 612, as shown. In one aspect, the transparent substrate is flexible, so that the entire array, including the substrate, can be spooled for delivery for higher assembly processing.

Figure 7:
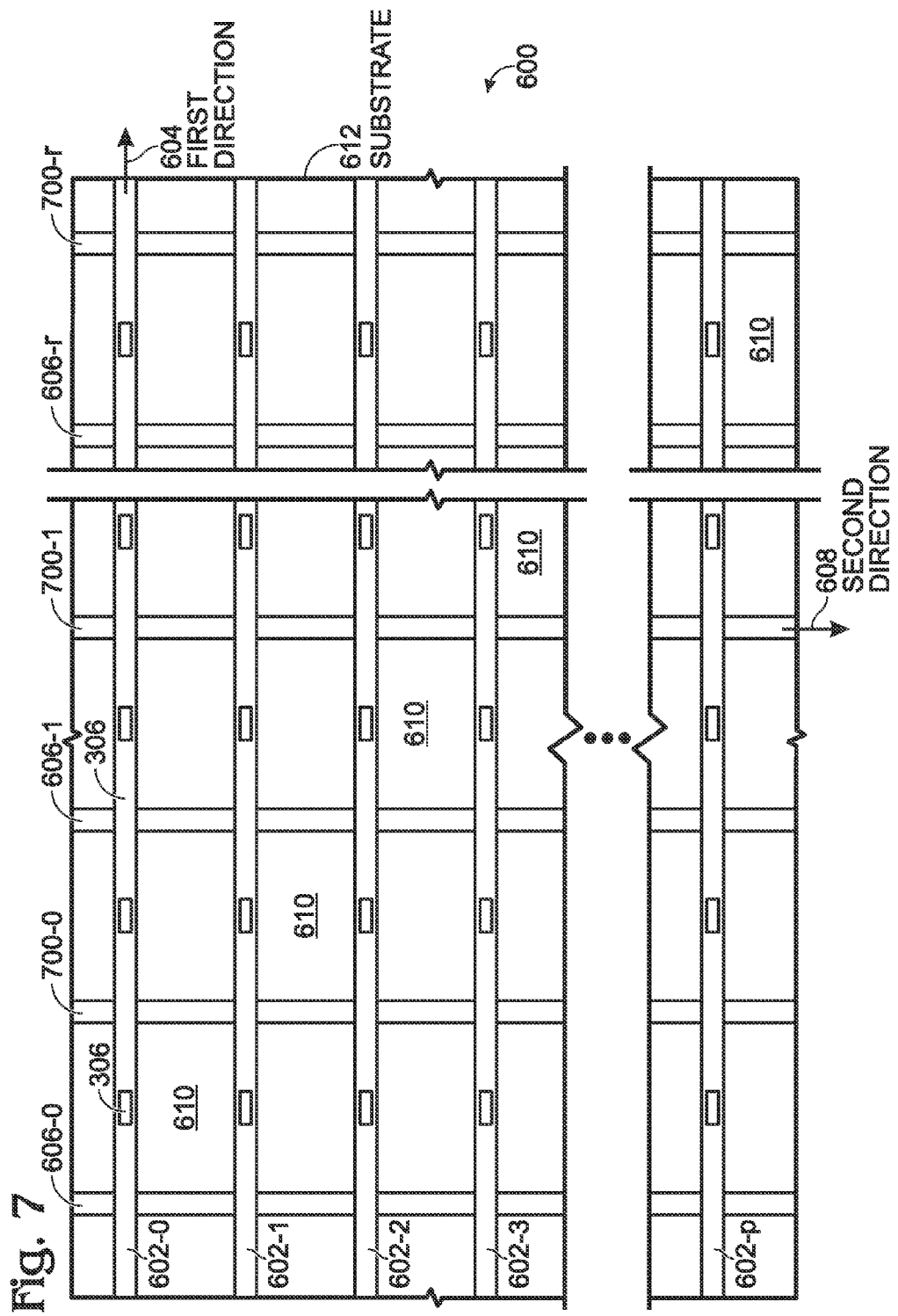
FIG. 7 is a plan view depicting a variation in the active matrix array of FIG. 6.

FIG. 7 is a plan view depicting a variation in the active matrix array of FIG. 6. In this aspect a set of parallel power metal lines 700-0 through 700-$p$ are aligned in the first direction 604, and alternating with the first metal lines 602-0 through 602-$p$. In the case of at least some of the control devices being the pixel switching elements described above in the explanation of FIG. 4, each second TFT first S/D electrode may be connected to an underlying power metal line through the via (see FIG. 10B). The first metal lines 602-0 through 602-$p$ may be gate lines, and the second metal lines 606-0 through 606-$r$ may be data lines, as shown. Alternatively, the first metal lines 602-0 through 602-$p$ may be data lines, and the second metal lines 606-0 through 606-$r$ may be gate lines. In another aspect not shown, both the gate and control lines may be CoW, with control devices.

FIGS. 8A and 8B are, respectively, plan and cross-sectional views of a CoW control device repeated unit. The metal wire 302 may have a rectangular cross section with width 800 in the range of 10 μm to 1 mm, and thickness 802 in the range of 10 μm to 100 μm. The wire 302 may, for example, be made of stainless steel, Al, Cu, Ni, Mo, or any of their alloys. Circuit and device blocks may be fabricated directly on the surface of the metal wire 302. Some of these blocks may be interconnected on the same metal wire or connected to other components (off of the metal wire). Through-holes or vias may be formed on the metal wire to facilitate such connections. The features formed on the surface of the wire may comprise repeated units 804.

FIG. 9 is a plan view of an active matrix array with repeated units. One application for metal wires with CoW repeated units is for backplane arrays. In that case, the electronic circuit that controls the operation of a pixel is the repeated unit 804. The extent of the repeated unit is then bound by the size of the pixel. The spacing between repeated units is determined by the pixel pitch (PPI). Taking the example of a 50 PPI backplane, the pixel size is calculated to be 508 μm. In this case, the pixel controlling circuit needs to be integrated within a wire length of less than 508 μm, and the repeated unit pitch is 508 μm.

Although CoW devices and circuits are shown as fabricated on gate wires, there is no real restriction as to which wire bears circuit elements, or that such elements must exist on only one type of wire. These choices depend primarily on the type of control circuits needed and tradeoffs between ease of integration and manufacturing cost.

Figure 10A:
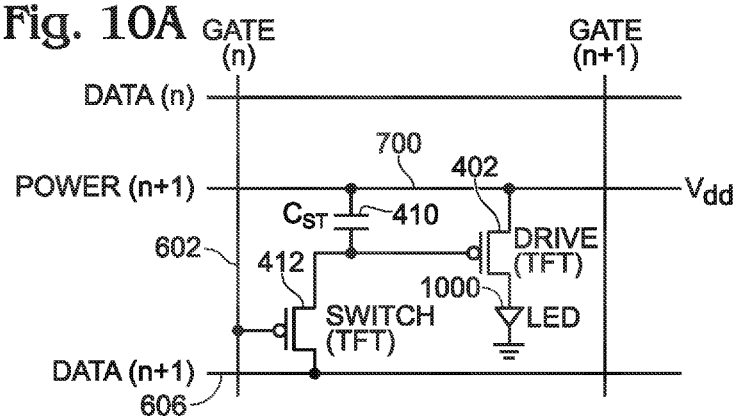
FIGS. 10A and 10B are, respectively, schematic and perspective diagrams of a pixel switching element for use with an LED type of pixel.
Figure 10B:
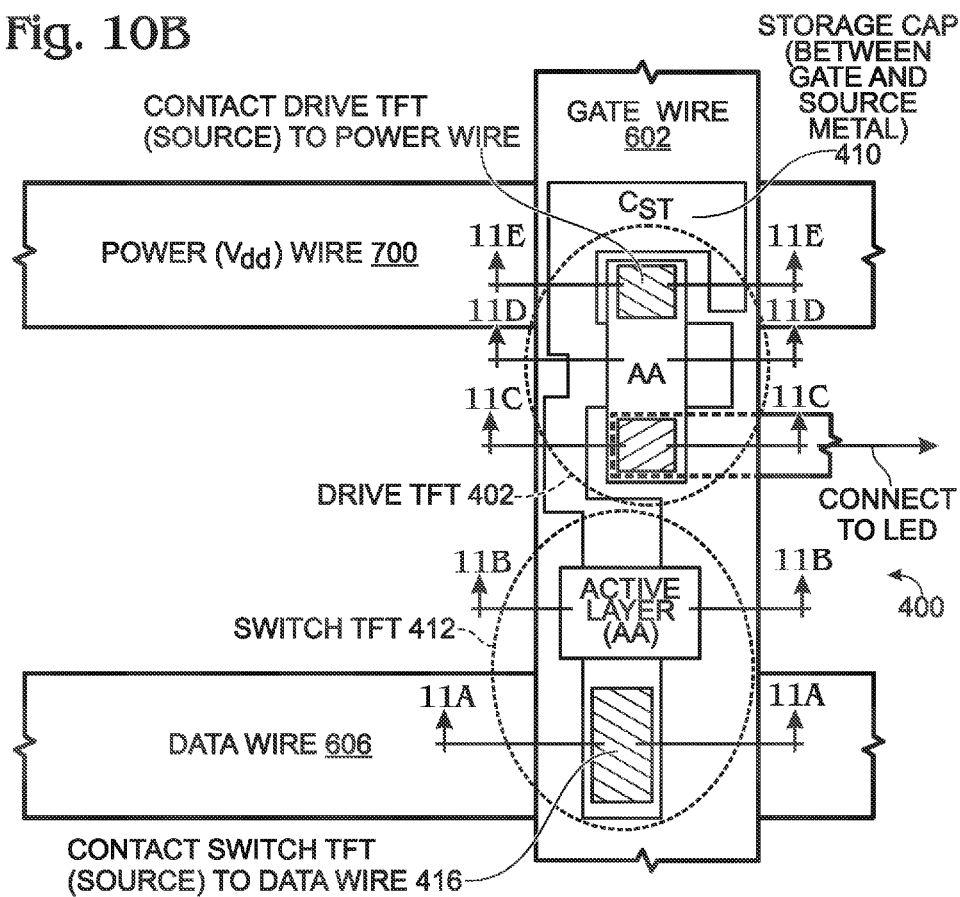

FIGS. 10A and 10B are, respectively, schematic and perspective diagrams of a pixel switching element for use with an LED 1000 type of pixel. The pixel switching element 400 is one example of a repeated unit. The pixel switching element 400 is laid out on the metal wire 602 (gate wire) that supplies the transistor gate-controlling signal. This circuit utilizes connections to two more wires, a wire 700 carrying a power signal and a wire 606 carrying a data signal to enable the proper operation of the pixel. Preferable, all device and circuit blocks are fabricated on a single wire in order to simplify the overall fabrication process. In the specific example of FIGS. 10A and 10B, only the gate wire needs to be fabricated with CoW control devices.

FIGS. 11A through 11E are partial cross-sectional views of the CoW pixel switching element of FIG. 10B. The switch TFT 412, drive TFT 402, and capacitor 410 are primarily located on the surface of the gate wire 602 and are fabricated during the preparation of the gate wire (offline to the panel assembly). The three principal metal wires (gate 602, data 606, and power 700) are laid out on the backplane substrate and other materials are used to ensure electrical connections between wires, as needed. For example, a conductive adhesive 1100 may be used to provide electrical connection between data wire 606 and gate wire 602, LED electrode 1000 and gate wire 602, and power wire 700 and gate wire 602. The LED electrode 1000 can be formed by solution processing (e.g. printing) methods, and the conductive adhesive 1100 can be ink-jet printed at various steps of the backplane assembly process. Alternatively, LED elements can be fabricated prior to the assembly of the various wires to form the controlling active matrix array.

FIG. 12 is a flowchart illustrating a method for forming a CoW. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 1200.

Step 1202 forms an electrically conductive metal wire and Step 1204 forms a series of discrete control devices overlying the metal wire. Typically, Step 1204 forms the series of discrete control devices includes using film deposition and photolithographic etching steps. The discrete control devices formed in Step 1204 may include a plurality of control devices each having an electrode electrically connected to the metal wire. Alternatively, the control devices may have electrodes that are electrically isolated from the metal wire. Some examples of control devices include TFTs, thin-film diodes, pixel switching elements, resistors, capacitors, inductors, and combinations of the above-mentioned devices.

In one aspect, forming the series of discrete control devices in Step 1204 includes substeps. Step 1204$a$ forms an electrode on a metal wire top surface. Step 1204$b$ forms a via from the metal wire top surface to a metal wire bottom surface, electrically connected to the electrode. In another aspect, Step 1206 forms an insulation layer overlying the control devices. Step 1208 selectively etches the insulation layer to expose electrodes from a plurality of control devices.

FIG. 13 is a flowchart illustrating a method for forming a woven active matrix array. The method begins at Step 1300. Step 1302 provides a substrate with a top surface. Step 1304 forms a set of parallel first metal lines aligned in a first direction overlying the substrate top surface. Step 1306 forms a set of parallel second metal lines aligned in a second direction orthogonal to the first direction, overlying the first metal lines. Step 1308 forms pixel regions between first and second metal line intersections. With respect to Step 1306, a plurality of metal lines from the second metal lines comprise serially configured CoW control devices overlying an outer surface of the second metal line, where each control device is associated with a corresponding pixel region. Step 1310 forms a pixel device in each pixel region. Step 1312 form electrical contacts between each pixel device and a corresponding control device.

In one aspect, forming the second metal lines in Step 1306 includes forming second metal lines having insulated top and bottom surfaces that are selectively etched to expose control device electrodes. Then, prior to forming the second metal lines, Step 1305 deposits an electrically conductive adhesive overlying the first metal lines. Subsequent to forming the second metal lines, Step 1307 forms electrical contacts between the first metal lines and the control device electrodes.

CoW control devices, a woven active matrix array, and corresponding fabrication processes have been provided. Examples of particular devices, interconnections, pixel types, and process steps have been presented to illustrate the invention. However, the invention is not limited to merely these examples. Other variations and embodiments of the invention will occur to those skilled in the art.

We claim:

1. A woven active matrix array comprising:
   a set of parallel first metal lines aligned in a first direction;
   a set of parallel second metal lines aligned in a second direction orthogonal to the first direction, each second metal line having a top surface and a bottom surface;
   wherein the first metal lines intersect the second metal lines to form pixel regions;
   wherein a plurality of metal lines from the second metal lines comprise serially configured circuit-on-wire (CoW) control devices overlying an outer surface of the second metal line;
   wherein each control device is associated with a corresponding pixel region; and,
   wherein a plurality of control devices each comprises:
      a via through the second metal wire from the top surface to the bottom surface; and,
      a second electrical contact accessible through the via.

2. The array of claim 1 wherein each control device further comprises a top surface with an accessible third electrical contact; and,
   wherein each control device is a first thin-film transistor (TFT), with a gate electrode accessible through the second metal wire, wherein the second electrical contact is a first source/drain (S/D) electrode, and wherein the third electrical contact is a second S/D electrode.

3. The array of claim 1 wherein each control device further comprises a top surface with an accessible third electrical contact and wherein each control device is a pixel switching element comprising:
   a first TFT, with a gate electrode accessible through the second metal wire, wherein the second electrical contact is a first S/D electrode, and the wherein third electrical contact is a second S/D electrode;
   a storage capacitor connected to the second S/D electrode of the first TFT;
   a second TFT comprising:
      a via through the second metal wire from the top surface to the bottom surface;
      a first S/D electrode accessible through the via;
      a gate electrode connected the second S/D electrode of the first TFT; and,
      a second S/D electrode.

4. The woven active matrix array of claim 3 further comprising:
   a set of parallel power metal lines aligned in the first direction, and alternating with the first metal lines; and,
   wherein each second TFT first S/D electrode is connected to an underlying power metal line through the via.

5. The array of claim 3 further comprising:
   a pixel device connected to the second S/D electrode of each second TFT.

6. The array of claim 1 wherein the second metal wire further comprises:
   an insulation layer overlying the second metal wire top and bottom surfaces, selectively etched to expose control device electrodes.

7. The array of claim 1 wherein a plurality of metal lines from the first metal lines comprise serially configured CoW control devices overlying a surface of the first metal line.

8. The array of claim 1 wherein a plurality of control devices each comprises at least a first electrical contact accessible through the second metal wire.

* * * * *